United States Patent [19]

Kageyama et al.

[11] Patent Number: 5,287,289
[45] Date of Patent: Feb. 15, 1994

[54] LOGIC SYNTHESIS METHOD

[75] Inventors: Naohiro Kageyama, Koganei; Chihei Miura, Kanagawa; Tsuguo Shimizu, Sayama, all of Japan

[73] Assignee: Hitachi, Ltd., Tokyo, Japan

[21] Appl. No.: 682,608

[22] Filed: Apr. 9, 1991

[30] Foreign Application Priority Data

Apr. 13, 1990 [JP] Japan .................. 2-096405
Nov. 9, 1990 [JP] Japan .................. 2-302400

[51] Int. Cl.⁵ .................................. G06F 15/60
[52] U.S. Cl. ........................ 364/489; 364/488
[58] Field of Search ............ 364/488, 489, 490, 491

[56] References Cited

U.S. PATENT DOCUMENTS

| | | | |
|---|---|---|---|
| 4,703,435 | 10/1987 | Darringer et al. | 364/489 |
| 4,882,690 | 11/1989 | Shinsha et al. | 364/490 |
| 4,964,056 | 10/1990 | Bekki et al. | 364/488 |
| 5,003,487 | 3/1991 | Drumm et al. | 364/489 |
| 5,029,102 | 7/1991 | Drumm et al. | 364/489 |
| 5,041,986 | 8/1991 | Tanishita | 364/489 |
| 5,150,308 | 9/1992 | Hooper et al. | 364/489 |

OTHER PUBLICATIONS

Kanwar Jit Singh, et al., "Timing Optimization of Combinational Logic", ICCAD 88, 1988, pp. 282–285. (Provided in English).

Primary Examiner—Vincent N. Trans
Attorney, Agent, or Firm—Fay, Sharpe, Beall, Fagan, Minnich & McKee

[57] ABSTRACT

A logic circuit the functions of which have been expressed by a Boolean expression is subdivided, and then each of the subdivided logic circuit portions corresponds to each of the Boolean expressions. A plurality of logic circuits whose functions are equal to each other, whose delay times and gate numbers are different from each other, are synthesized every subdivided circuit portions, and a restriction condition formula is formed by employing the synthesized logic circuit under a restriction condition of the delay time designated by a user. While a linear programming is applied under the restriction condition and the number of gates is used as an objective function, such a logic circuit that the objective function takes a stationary value (a minimum value in the present invention) is selected with respect to each of subdivided portions, whereby an overall logic circuit is constructed.

7 Claims, 21 Drawing Sheets

FIG. 2
GATE NUMBER / DELAY TIME GRAPH 800
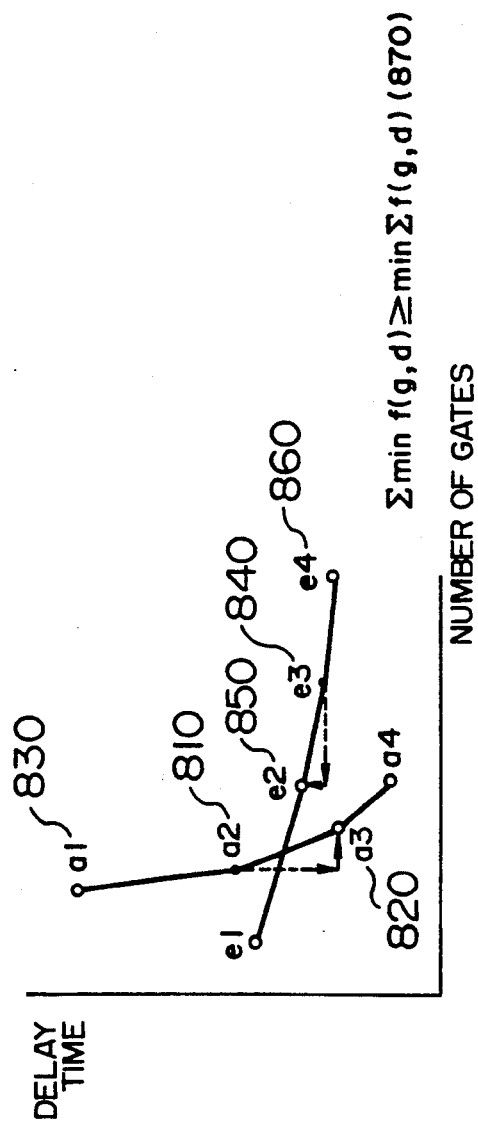
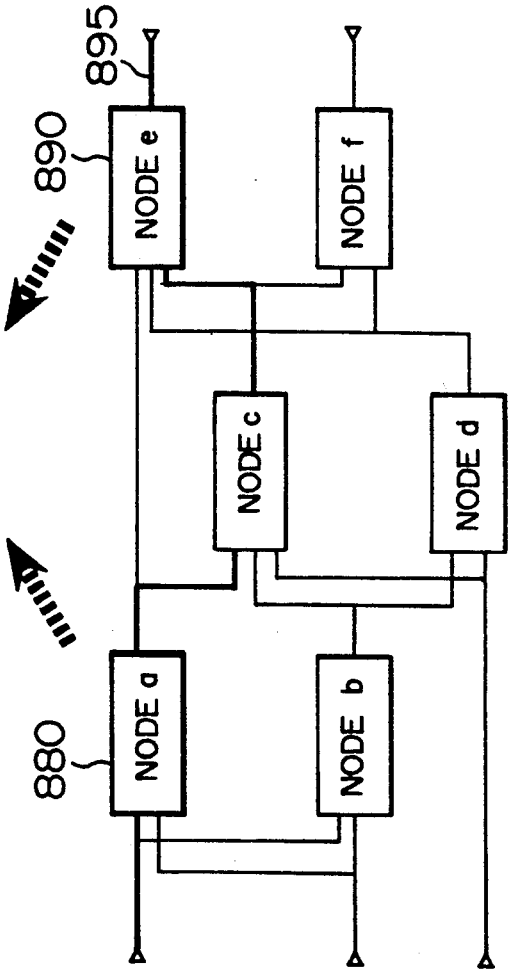

| ITEM NUMBER 400 | NODE NUMBER 410 | BOOLEAN EXPRESSION 420 | SIGNAL SOURCE POINTER 430 | | | | | | | | | LOGIC CIRCUIT PATTERN POINTER 440 | | | | | | |
|---|---|---|---|---|---|---|---|---|---|---|---|---|---|---|---|---|---|
| | | | | | | | | | | | | HP 441 | Num 442 | Inf 443 | HP | Num | Inf |
| 1 | 1 | a&b | a | b | | | | | | | | 1 | | | | | |
| 2 | 2 | ^c&^d | c | d | | | | | | | | 1 | | | | | |
| 3 | 3 | ^i&^j+^i&j+i&^j | i 1 | j 2 | | | | | | | | 1 | 1 | 1 | | | |
| 4 | 4 | e&f&j+e&f&i+h&j+e&f&g | e | f | g | h | i 1 | j 2 | | | | 2 | 4 | 2 | 6 | 6 | 3 |
| 5 | 5 | ^k&l | k 3 | l 4 | | | | | | | | | | | | | |

FIG. 6

| ITEM NUMBER | BOOLEAN EXPRESSION STORAGE REGISTER | SIGNAL SOURCE POINTER ||||
|---|---|---|---|---|---|
| 1 | ^(i&j) | i | j | | |
| 2 | g+i+j | g | i | j | |
| 3 | e&f&C | e | f | C \| 2 | |
| 4 | h&j | h | j | | |
| 5 | A+B | A \| 3 | B \| 4 | | |
| 6 | e&f | e | f | | |
| 7 | h+E | h | E \| 6 | | |
| 8 | i+g | i | g | | |
| 9 | j&C | j | C \| 7 | | |
| 10 | E&D | E \| 6 | D \| 8 | | |
| 11 | A+B | A \| 9 | B \| 10 | | |
| | | | | | |

500 — ITEM NUMBER
510 — BOOLEAN EXPRESSION STORAGE REGISTER
520 — SIGNAL SOURCE POINTER

| ITEM NUMBER | Nam | D | Nam | D | Nam | D | Nam | D | Nam | D | Nam | D | Nam | D | NUMBER OF GATES |
|---|---|---|---|---|---|---|---|---|---|---|---|---|---|---|---|
| 1 | i | 2 | j | 2 | | | | | | | | | | | 2 |
| 2 | e | 2 | f | 2 | g | 3 | h | - | i | 2 | j | 3 | | | 4 |
| 3 | e | 4 | f | 4 | g | 3 | h | - | i | 3 | j | 2 | | | 6 |

600 — ITEM NUMBER
611 — Nam
612 — D
610 — DELAY TIME
620 — NUMBER OF GATES

FIG. 10a

| PATH NUMBER | TITLE OF SIGNAL | PATH ROUTE (REPRESENTATION BY NODE NUMBER) | RESTRICTION CONDITION FORMULAE (RESTRICTION ON DELAY TIME) |
|---|---|---|---|
| 1 | a,b | 1→3→5 | $\lambda(1,1)+2\lambda(3,1)+\lambda(5,1) \leq 6$ |
| 2 | c,d | 2→3→5 | $2\lambda(2,1)+3\lambda(3,1)+2\lambda(5,1) \leq 6$ |
| 3 | e | 4→5 | $2\lambda(4,1)+4\lambda(4,2)+\lambda(5,1) \leq 6$ |
| 4 | f | 4→5 | $2\lambda(4,1)+4\lambda(4,2)+\lambda(5,1) \leq 6$ |
| 5 | g | 4→5 | $3\lambda(4,1)+3\lambda(4,2)+\lambda(5,1) \leq 6$ |
| 6 | a,b | 1→4→5 | $\lambda(1,1)+3\lambda(4,1)+3\lambda(4,2)+\lambda(5,1) \leq 6$ |
| 7 | c,d | 2→4→5 | $2\lambda(2,1)+3\lambda(4,1)+2\lambda(4,2)+\lambda(5,1) \leq 6$ |

FIG. 10b

| NODE | RESTRICTION CONDITION FORMULAE |
|---|---|
| 1 | $\lambda(1,1)=1$ |
| 2 | $\lambda(2,1)=1$ |
| 3 | $\lambda(3,1)=1$ |
| 4 | $\lambda(4,1)+\lambda(4,2)=1$ |
| 5 | $\lambda(5,1)=1$ |

FIG. 16

| ITEM NUMBER | LOGIC CIRCUIT PATTERN NAME | LOGIC INFORMATION TABLE POINTER | |
| --- | --- | --- | --- |
| | | HEAD ITEM NUMBER | ELEMENT NUMBER |
| 1 | IB001 | 1 | 1 |
| 2 | OB001 | 2 | 3 |
| 3 | OB002 | 5 | 2 |
| 4 | | | |

| ITEM NUMBER | BOOLEAN EXPRESSION | CONNECTING INFORMATION ||||||| CUBE REGISTER TABLE POINTER ||
|---|---|---|---|---|---|---|---|---|---|---|
| | | NAME OF INPUT SIGNAL |||||| OUTPUT | HEAD ELEMENT | ELEMENT NUMBER |
| 1 | a·^b·c·d+a·^b·c·^e+a·^b·f | a | b | c | d | e | f | OUT | 1 | 3 |
| 2 | a·^b·X | a | b | X | | | | OUT | | |
| 3 | c·Z+f | c | Z | f | | | | X | | |
| 4 | ^e+d | e | d | | | | | Z | | |
| 5 | a·^b·f+a·^b·c·Z | a | b | c | f | Z | | OUT | | |
| 6 | ^e+d | e | d | | | | | Z | | |
| 7 | | | | | | | | | | |

FIG. 18a

| ITEM NUMBER | a | b | c | d | e | f | |
|---|---|---|---|---|---|---|---|
| 1 | 01 | 10 | 01 | 01 | 11 | 11 | |
| 2 | 01 | 10 | 01 | 11 | 10 | 11 | |
| 3 | 01 | 10 | 11 | 11 | 11 | 01 | |
| 4 | | | | | | | |
| | | | | | | | |

FIG. 18b

| a | b | c | d | e | f | |
|---|---|---|---|---|---|---|
| 1 | 1 | 1 | 0 | 0 | 0 | |

LOGIC SYNTHESIS METHOD

BACKGROUND OF THE INVENTION

The present invention relates to a method for shortening delay time of a synthesized logic circuit and also for reducing the number of gates employed therein, in a logic synthesis system in which a logic design of a digital logic system is performed by a computer.

In the conventional method for shortening the delay times with respect to the Boolean expressions indicative of the functions of the logic circuit, the logic circuit to be processed is subdivided into plural portions or sections, slacks in the delay times for the subdivided sections are calculated, and while reconstructing the logic circuit from a region having a small slack, the delay time is shortened. This conventional method is described in detail in, for example, "Timing Optimization of Combinational Logic" (ICCAD 88, 1988, pages 282 to 285).

In the conventional method, since the delay times are sequentially improved every subdivided portions of the logic circuit to be processed, a distribution of the delay times is restricted, as compared with such a case that an overall logic circuit is handled as a single logic circuit so as to improve the delay times. As a consequence, there are some possibilities that such a logic circuit having a redundant logic is synthesized. To the contrary, there has been no proposal that an overall logic circuit is handled as a single logic circuit to be processed, and logic optimization is carried out to simultaneously reduce both the delay time and the number of gates.

SUMMARY OF THE INVENTION

An object of the present invention is to handle logic circuits whose functions are expressed by Boolean expressions, to handle an overall logic circuit as a single logic circuit to be processed, and to obtain such a logic circuit capable of satisfying delay time restriction and having a less redundant portion by simultaneously reducing the delay time and the number of gates.

The above-described object may be achieved by forming an overall logic circuit with the steps of subdividing a logic circuit to be processed into subdivided portions; forming a plurality of logic circuits the functions of which are equal to each other every subdivided portions, the delay times and gate numbers of which are different from each other; forming a restriction condition formula by employing the formed logic circuit under a restriction condition of the delay times designated by a user; and selecting such a logic circuit that an objective function takes a stationary value (a minimum value in the present invention), while applying a linear programming as the gate numbers of the overall circuit for the objective function under the restriction condition.

In accordance with the delay time reducing method of the present invention, a plurality of logic circuits having equal functions with respect to the subdivided portions of the logic circuit to be processed and having different gate numbers and delay time from each other are formed or synthesized. While the linear programming is applied under the condition that the delay time restriction is used as a restriction condition and the number of gates are employed as the objective function, it is possible to select such a logic circuit that the objective function takes a stationary value from a plurality of logic circuits. As a result, the logic circuit capable of satisfying the delay time restriction containing no redundant logic may be obtained. In other words, a plurality of logic circuits are locally given to the logic circuit to be processed, and such a condition that the defined objective function owns the stationary value may be obtained by changing these combinations.

Also, according to the present invention, when the above-described logic circuit is synthesized, a description will now be made of a method for synthesizing some logic circuits at a high speed, in which the logic circuits whose functions are represented by Boolean expressions, and whose functions are identical to each other, and also whose delay times are different from each other. In accordance with the logic circuit synthesizing method of the present invention, a signal which cannot become a common factor for the respective product items of the sum of product form Boolean expressions for representing the logic circuits to be processed, is detected and thus omitted from the signals to be processed, so that such a case where no expression is modified even when the factorization is carried out. A plurality of signals when the final delay time of the logic circuit is not varied even when the sequence of factorization is changed, may be handled as a single signal. As a consequence, it can prevent that the logic circuit patterns where the delay times of the respective signals are identical to each other are synthesized.

BRIEF DESCRIPTION OF THE DRAWINGS

FIG. 2 is an explanatory diagram of concept of the present invention;

FIG. 4 represents a constructive example of a register table for a Boolean network;

FIG. 6 represents a constructive example of a register table for a logic circuit pattern;

FIG. 7 indicates a constructive example of an information table for a logic circuit pattern;

FIGS. 10A and 10B show examples of a restriction condition;

FIG. 16 is a diagram for showing a construction of a logic circuit pattern management table;

FIG. 17 is a diagram for representing a construction of a logic information table;

FIGS. 18A and 18B are diagrams for showing a construction of a cube register table;

DESCRIPTION OF THE PREFERRED EMBODIMENTS

Referring now to drawings, an embodiment of the present invention will be described in detail.

Figure 1:
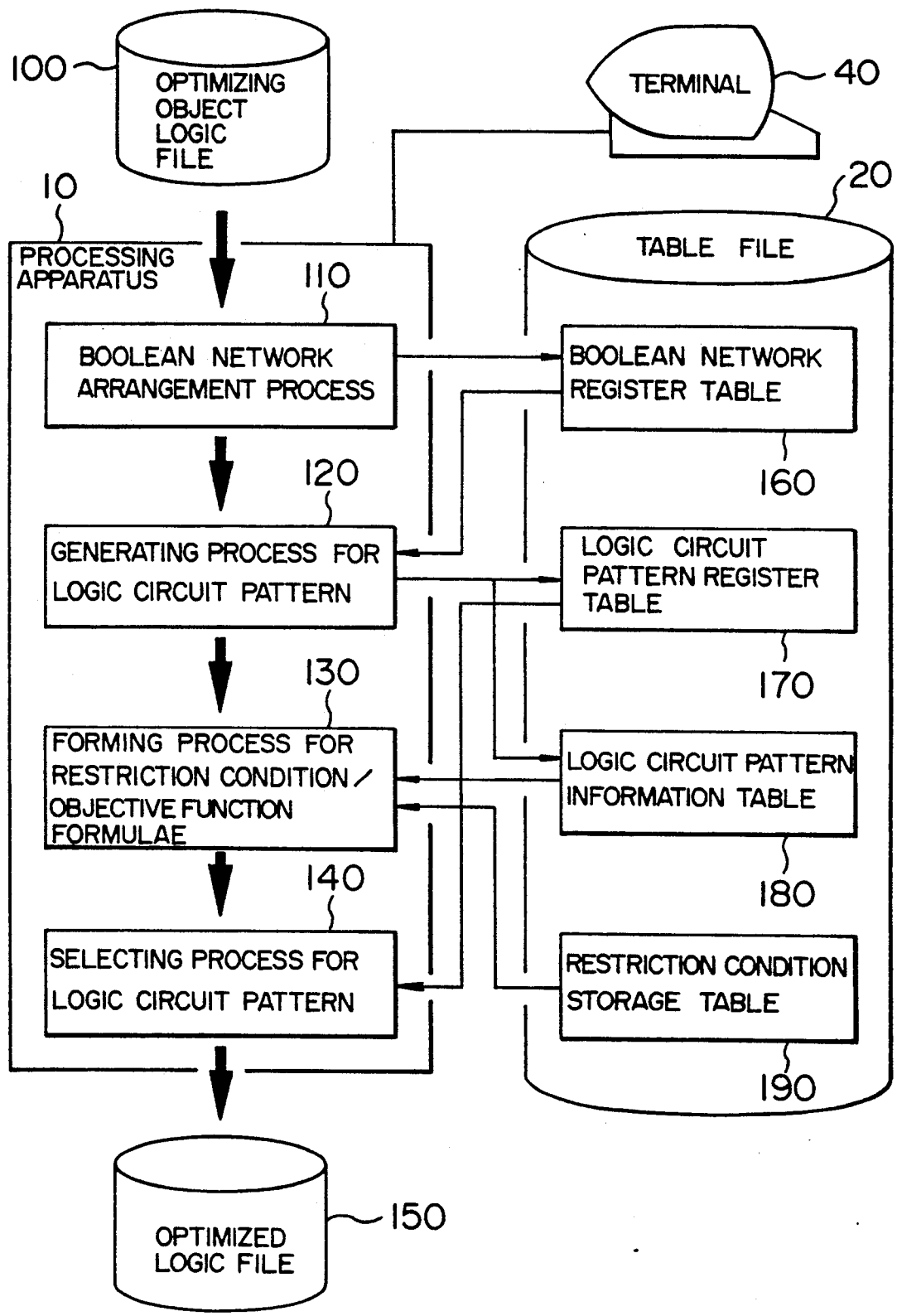
FIG. 1 is a schematic diagram for representing an example of an arrangement for a computer system to perform the present invention.

FIG. 1 is a schematic diagram for showing a constructive example of a computer system for executing a program when the present invention is realized as this program. This computer system is arranged by an optimizing object logic file 100 as an input; a result file 150 for logic optimization as an output; a file group constructed of a table file 20 required for executing the program, and a processing apparatus 10 for executing the program (logic optimization program) according to the present invention, and also a terminal 40 for inputting an instruction made by an operator. In accordance with the present invention, a logic circuit which has been stored in the optimizing object logic file 100 is used as an object, the number of gates and delay time are reduced, and a result is outputted to the result file 150 for logic optimization. The logic circuit stored in the optimizing object logic file 100 is represented by logic gates and connection relationship among them. A process content of the present invention is mainly subdivided into 4 states. Based upon the logic circuit inputted from the optimizing object logic file 100, in a Boolean network arrangement process 110, with employment of a graph where nodes are connected with each other by edges, an entire Boolean network is arranged and then registered in a Boolean network register table 160. Since the logic circuits corresponding to the respective nodes do not contain a fan out therein, a logic circuit which can be expressed by a single Boolean expression.

A process 120 for generating some logic circuit patterns from the Boolean networks at the respective nodes is performed. That is to say, a plurality of logic circuits, the number of gates of which is different from each other, or the delay times of which are different from each other, are produced from the Boolean networks at the respective nodes. These logic circuits are equivalent to the Boolean networks i-n view of functions thereof. This is called as a logic circuit pattern. Thus, the generated logic circuit patterns are registered in a logic circuit pattern register table 170. Also, both the number of gates and the delay times of this logic circuit pattern are registered in a logic circuit pattern information table 180.

Subsequently, in a forming process 130 for function formulae, based upon the logic circuit patterns, both the restriction condition formula with respect to the delay time and the objective function formula with respect to the number of gates are formed with employment of the delay time restriction which has been stored in the restriction condition storage table 190 and is designated by a user.

Finally, in a selecting process 140 for logic circuit patterns, the linear programming approach is applied to the restriction condition formula and the objective function related to the number of gates, and the logic circuit patterns optimized for each node unit are selected all over the logic circuits. The optimized logic circuits are outputted to a logic optimized result file 150.

FIG. 2 conceptionally represents a feature of a method embodied in the present invention. In accordance with the method embodied in the present invention, an objective logic circuit is represented by a directed graph constructed of nodes and edges. The logic circuit as shown in FIG. 2 will now be referred to as a "Boolean network". Considering the respective logical ideas represented in the nodes of the Boolean network, when the logic circuits whose gate number and delay time are different from each other and whose functions are equivalent to each other are represented on a gate number/delay time graph 800, the graph will decline in the right hand in general. The gate number Vs delay time graph is represented by representation for showing a relationship between the number of gates of a certain node and delay time of a single input signal into the node, assuming now that the number of gates is indicated by an abscissa, and the delay time is indicated by an ordinate. It is now assumed that a "node a" is present at a point of a2 (810) in the gate number/delay time graph, before a logic change, and another "node e" is present at a point of e3 (840) in this graph before the logic change. Due to the logic change, the "node a" takes values of the gate number and delay time for any points of the Boolean logic, and also the edges represent the connection relationships among the nodes. The gate number/delay time graph 800, the graph will decline in the right hand in general. The gate number/delay time graph implies a graphic a1, a3, a4. Also, the "node e" may take values of the gate number and delay time for any points of e1, e2 and e4. At this time, as represented in the gate number/delay time graph, in the "node a", an increase (a2→a3) in the gate number by reducing the delay time is small, as compared with an increase (e2-→e4) in the gate number of the "node e". To the contrary, in the "node e", an increase (e3→e2) in the delay time caused by reducing the number of gates is less than an increase (a2→a1) in the delay time in the "node a". As a consequence, in the "node a", the delay time is shortened and the number of gates is reduced in the "node e", whereby such a logic circuit having the least number of gates and the shortest delay time can be obtained in view of the overall logic circuit. In other words, when the nodes contributed to shorten the delay times are combined with the nodes contributed to reduce the number of the gates in the overall logic circuit, instead of such a solution that the number of gates is reduced under restriction of the delay time allocated to the respective node units, the logic circuit capable of satisfying the above-described conditions, i.e., less gate number and shorter delay time may be achieved. This is represented by a formula 870. It should be noted that symbol "f" indicates a certain evaluation function arranged by the number of gates and the delay time, whereas symbol "Σ" is a summation of all of the nodes. It implies that the value of the evaluation function becomes small when the evaluation function is minimized in view of the overall logic circuit, rather than when the evaluation function is minimized in unit of each node.

Figure 3:
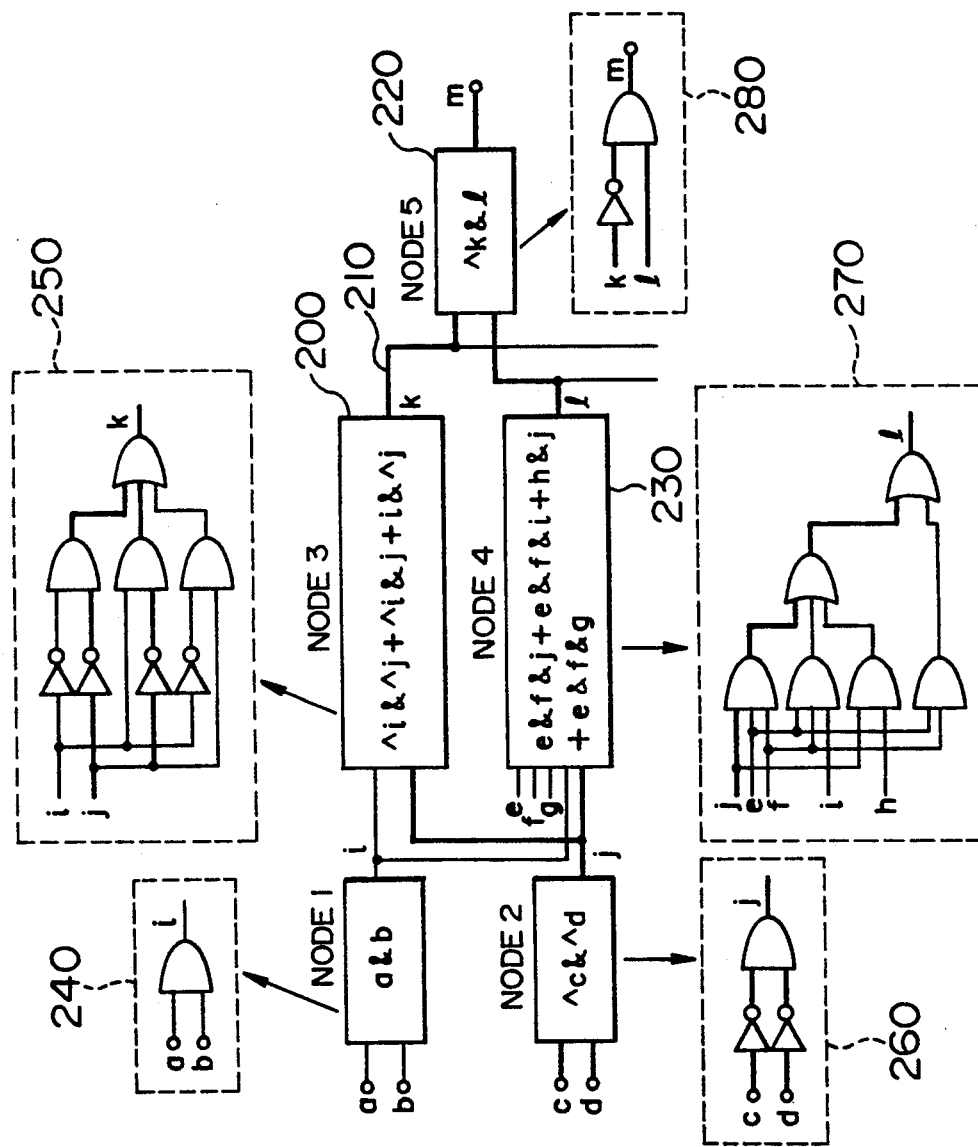
FIG. 3 illustrates an example of a computer logic to be optimized.

FIG. 3 is a schematic diagram for showing one example of a Boolean network. In this network, Boolean networks representative of functions are expressed at each of the nodes, and these nodes are connected with each other with employment of the respective edges. For example, at a node 3 (200), two different sorts of signals "i" and "j" are inputted, and an output signal "k"

is formed by sum of product form Boolean expressions $\wedge i \& \wedge j + \wedge i \& j + i \& \wedge j$. It should be noted that symbol $\wedge$ denotes "NOT", symbol "&" indicates "AND" and symbol "+" represents "OR". Also, an edge 210 represents a connection relationship between a node 3 (200) and a node 5 (220). Assuming now that a three-input gate is represented, a node 1 is shown by a gate circuit diagram 240; a node 2 is represented by a gate circuit diagram 260; a node 3 is indicated by a gate circuit diagram 250; a node 4 is shown by a gate circuit diagram 270, and also a node 5 is indicated by a gate circuit diagram 280. It should be understood that when there are excessive input terminals if the logic gates are expressed by the 3-input gates, these input terminals have been omitted.

FIG. 4 illustrates a structure of a Boolean network register table 160 in which the connecting relationships of the Boolean networks shown in FIG. 3 have been described. The Boolean network register table 160 is constructed of an item number 400; a node number storage region 410 for storing therein numbers of nodes employed in the Boolean network; a Boolean expression storage region 420 for storing therein the Boolean expressions to express the functions of the nodes; a signal source pointer storage region 430 indicative of signal sources for the respective nodes; and also a logic circuit pattern pointer 440. Furthermore, the logic circuit pattern pointer 440 contains pointer information of the logic circuit pattern register table 170 for storing therein a plurality of logic circuit patterns derived from the Boolean networks at the respective nodes, and also the logic circuit pattern information table 180 for storing data on both the delay time and gate number of this logic circuit pattern. As will be described later, in the logic circuit pattern register table 170, the respective nodes to construct the logic circuit pattern have been registered continuously. As a consequence, the logic circuit pattern within the logic circuit pattern register table 170 may be designated by employing both a storage region "HP 441" of a pointer for designating a head entry with the logic circuit pattern register table 170 and another storage region "Nun 442" of entry number (item number), into which the logic circuit patterns conducted from the Boolean expression have been stored. Also, a storage region "Inf 443" of a pointer for designating an entry within the logic circuit pattern information table 180 is contained in the logic circuit pattern pointer storage region 440. In the signal source pointer storage region 430, when the signal source corresponds to a primary input for an objective logic circuit, a title of signal is directly registered, whereas when the signal source corresponds to an internal signal, both a title of signal and the item number in the Boolean network register table 160 for the node to synthesize this signal are stored. As a consequence, the connecting relationships among the nodes may be expressed.

Figure 5A:
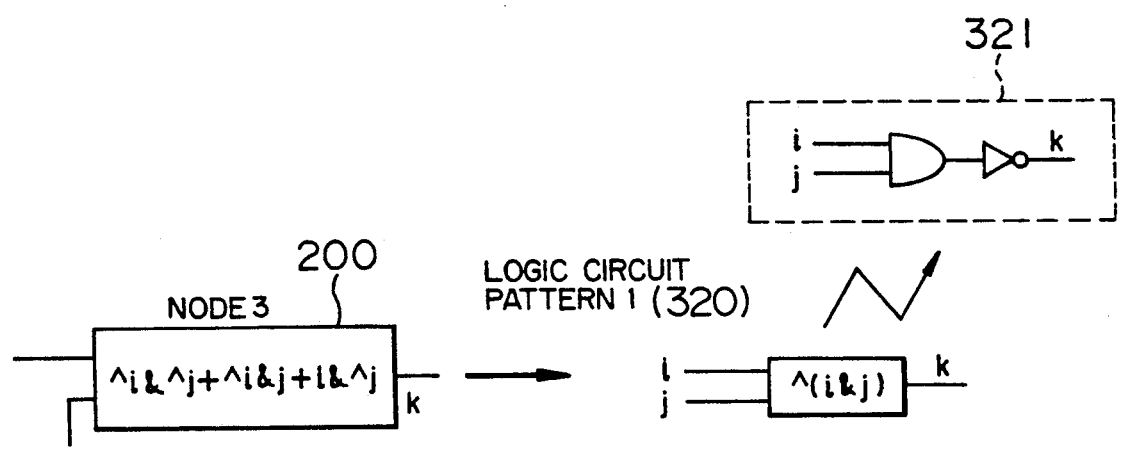
FIGS. 5A and 5B are illustrations for conceptionally explaining a generation of a logic circuit pattern.
Figure 5B:
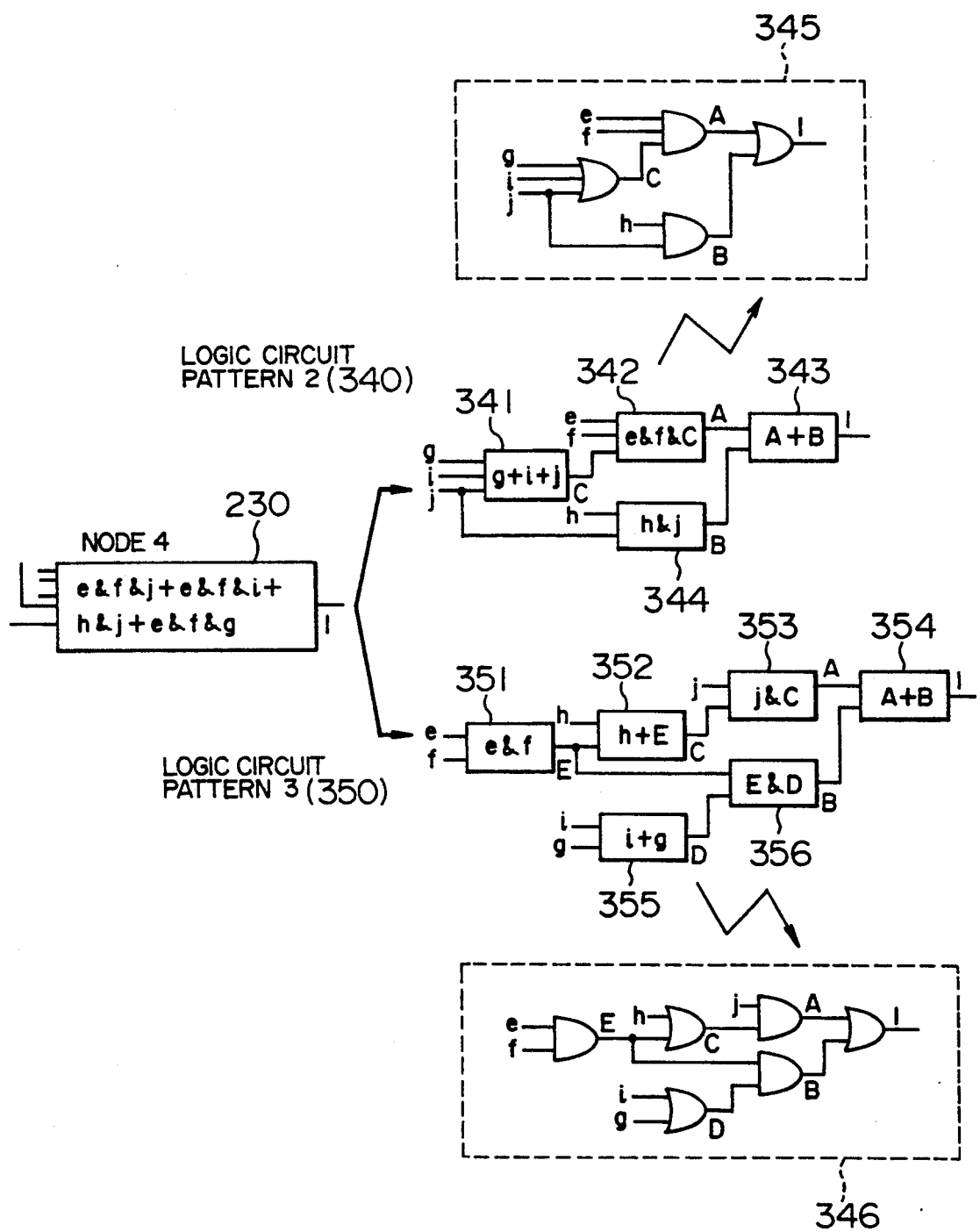

FIG. 5 represents an example to produce logic circuit patterns from the respective nodes of the Boolean networks. In FIG. 5a, there is shown that a logic circuit pattern 1 (320) is produced by modifying the Boolean expression from the node 3 (200) in the Boolean network shown in FIG. 3. To the contrary, in FIG. 5b, there are shown that two different shorts of logic circuit patterns, i.e., a logic circuit pattern 2 (340) and a logic circuit pattern 3 (350) are produced from a node 4 (230) by way of the subdividing method for the nodes. Thus, either a single, or plural logic circuit patterns are generated at the respective nodes by the logic pattern generating process 120. If the logic circuit pattern 1 is expressed by employing the 3-input gates, this pattern becomes a gate circuit diagram 321, the logic circuit pattern corresponds to a gate circuit diagram 345, and the logic circuit pattern 3 corresponds to a gate circuit diagram 346. It should be noted that when these logic circuit patterns are expressed by the 3-input gates and there are excessive input numbers, the excessive input terminals are omitted.

FIG. 6 represents an example of a construction of the logic circuit pattern register table 170, in which the logic circuit patterns shown in FIG. 5 are indicated by a table form. The logic circuit pattern register table 170 is constructed of an item number 500, a Boolean expression storage region 510 for storing therein the Boolean expressions of the respective logic circuit patterns within the nodes, and also a signal source pointer storage region 520 for storing signals inputted into the nodes. In the signal source pointer storage region 520, when the signal source corresponds to a primary input for a logic circuit pattern, a title of this signal is directly registered, whereas when the signal source corresponds to an internal signal, both a title of this signal and an item number of the logic circuit pattern register table 170 for a node to synthesize this internal signal are stored. As a result, the connecting relationships among the nodes within the logic circuit pattern may be expressed.

FIG. 7 represents an example of a structure for the logic circuit pattern information table 180, into which the delay time and the number of gates of the respective logic circuit patterns shown in FIG. 5 have been stored. This information table 180 is arranged by an item number 600, a delay time storage region 610 for storing therein the delay times of the respective logic circuit patterns from the input to the output, and a gate number storage region 620 for storing therein the number of gates of the respective logic circuit patterns. The delay time storage region 610 is arranged by a storage region Nam 611 for titles of signals, and a storage region D612 for the delay time of the respective signals from the input to the output. In case that a plurality of signals are inputted into the logic circuit patterns, as shown in FIG. 7, the respective delay times are stored with respect to each of the titles of signals. When the signal passes through a plurality of signal paths, similar to the signal of the logic circuit pattern 2 (340) shown in FIG. 5, the longer delay time thereof is stored.

Figure 8:
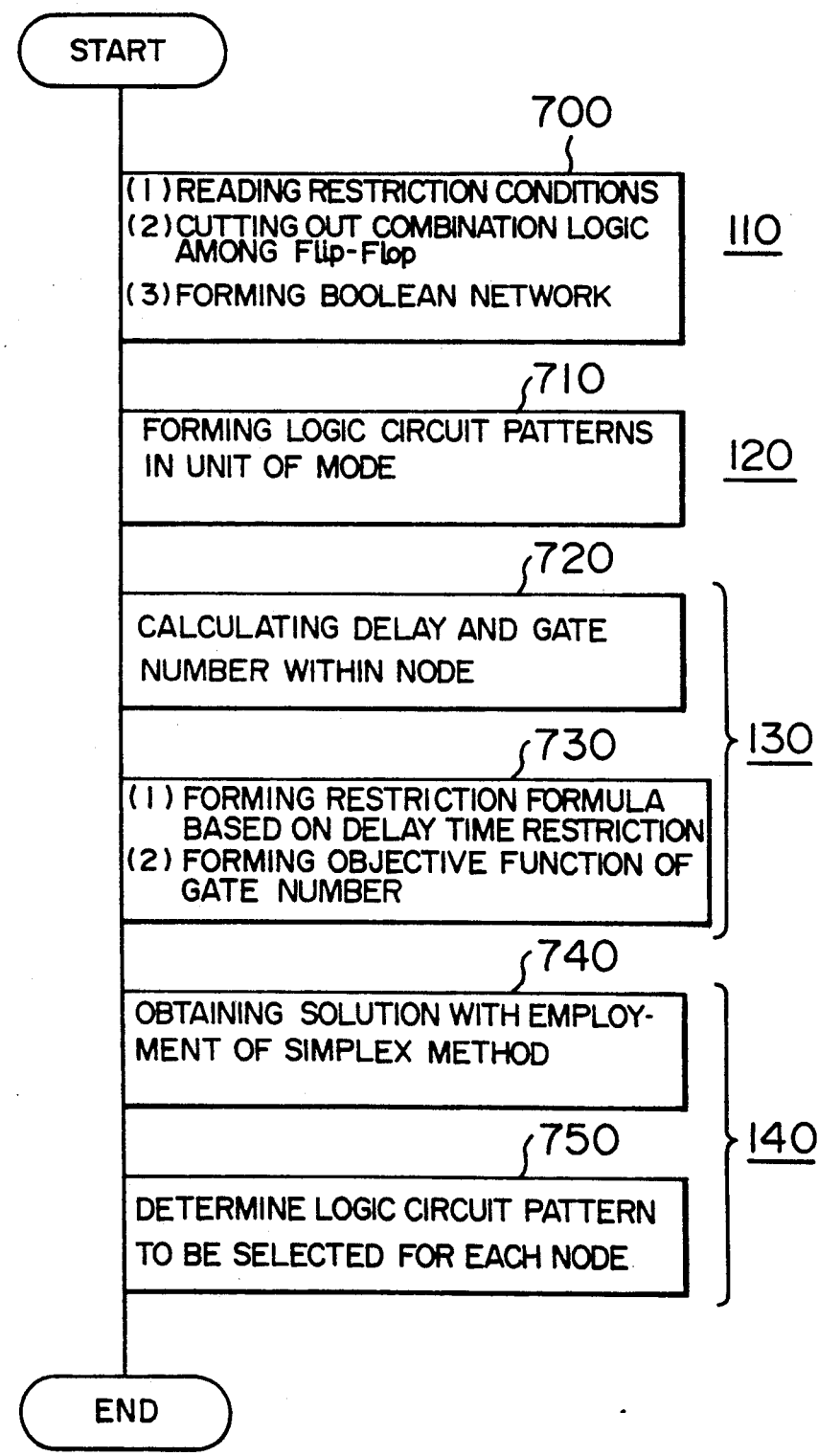
FIG. 8 is a PAD diagram for showing an example of a processing sequence of a logic optimization processing program.

In FIG. 8, there is shown a flow diagram for representing a detailed process sequence represented in FIG. 1, that is to say, FIG. 8 represents the generating process 120 for the logic circuit patterns, the forming process 130 for the restriction condition formula/objective function, and also the selecting process 140 for the logic patterns more in detail.

In accordance with the process sequence shown in FIG. 8, the detailed processing sequence for the logic circuit shown in FIG. 3 will now be explained.

STEP 1: Reading the Conditions, Cutting out the Combination Logic for the Circuit to be Processed, and Forming the Boolean Network (700)

As the restriction conditions, the delay times among a plurality of flip-flops; an input and the flip-flops; the flip-flops and an output; and the input and output are designated by a user and read as the restriction condition.

The combinational logic circuits among the flip-flops; the input and the flip-flops; the input and the output; and the flip-flops and the output are cut out from the overall logic circuit as the logic circuits to be processed, so as to form the Boolean network. In other words, according to the present invention, the sequential circuits contained in the logic circuit are not understood as the logic circuits to be processed. As the Boolean network forming method, for instance, the logic circuits having no fan out therein as the node 3 or 4 shown in FIG. 3, namely such logic circuits that one output signal is not connected to more than two elements, are employed as one unit, which is understood as a single node, and then a network where this node is connected is formed. This is established based on such a principle that if there is no fan out in the logic circuit, this logic circuit may be expressed by a single Boolean expression. The connecting relationship of the formed Boolean network is registered in the Boolean network register table 160.

In the example shown in FIG. 3, each of the nodes corresponds to such a logic circuit having no fan out, which is registered in the Boolean network register table 160. The results are shown in FIG. 4.

STEP 2: Forming a Logic Circuit Pattern of a Logic Circuit Within a Node (710)

As shown in FIG. 5, the logic circuit patterns are formed whose functions are equal to each other and whose gate numbers and delay times are different from each other in a unit of node. Since, for instance, the Boolean expressions present in the respective nodes correspond to multiply/summation type Boolean expressions, this is factorized by different variables so that the logic circuits having the different gate numbers and different delay times may be obtained. For instance, when the factorization is carried out with respect to either "e & f" or "j" of the node 4 (230), two different sorts of Boolean expressions are obtained as shown follows:

logic circuit pattern 2: (e & f) & (j+i+g) +h & j
logic circuit pattern 3: (e & j+h) & j+(e & f) & (g & i)

In the example of the Boolean network shown in FIG. 3, two different sorts of logic circuit patterns (340, 350) shown in FIG. 5 are obtained from the node 4 (230). The connecting relationship between the resultant logic circuit patterns are registered in the logic circuit pattern register table 170. The register results are shown in FIG. 6. Also, the logic circuit patterns are produced by similarly processing other nodes. A detailed generating method for the logic circuit patterns at this step will be described later. That is to say, when the logic circuit patterns are generated, a process for extracting factors required to factorize the Boolean expressions will be explained with reference to drawings after FIG. 12.

STEP 3: Calculating Both Delay Time and the Number of Gates of a Logic Circuit Pattern (720)

A calculation is made of the delay time when each of the input signals for the logic circuit patterns have passed through the respective logic circuit patterns. In other words, the number of the logic stages contained in the signal paths between the input and output of the logic circuit pattern are obtained as the delay time. In the example shown in FIG. 5, the logic stage numbers with regard to three sorts of logic circuit patterns are obtained and are registered in the logic circuit pattern information table 180. At this time, in case that the logic stage number is calculated from the Boolean expression, assuming now that a 3-input gate is used as the logic gate, the logic stage number is calculated and symbol "^" (NOT) is also added as one gate. There are some cases that a plurality of signal paths from the input to the output are present, depending on the signal. In these cases, the maximum values of the calculated logic stage numbers are employed as the delay time for this signal. The register results are shown in FIG. 7. In the logic circuit pattern 1, for instance, the number of gates becomes 2 and the delay time of the signal "i" becomes 2.

STEP 4: Forming a Restriction Formula Related to Delay Time (730)

Both the restriction formula related to the delay time and the objective function concerning the number of gates are formed with employment of the logic circuit patterns at the respective nodes.

To apply the linear programming, both the restriction condition equation and the objective function are required. According to this linear programming, the delay time designated by the user is employed as the restriction condition equation and a summation of the number of gates within the logic circuit to be processed is employed as the objective function.

The restriction condition equation for the delay time is formed as follows.

Assuming now that there are "m" pieces of paths of the logic circuits to be processed, each path may satisfy the restriction on "m" pieces of delay time designated by the user. An attention is given to the node "i" appearing at a certain path "k" ($1 \leq k \leq m$) in the logic circuit to be processed, a selective parameter corresponding to a j-th logic circuit pattern is set to $\lambda(i,j)$ among a plurality of logic circuit patterns having functions equivalent to those of the node "i". The selective parameter $\lambda(i,j)$ is equal to 0, 1, when $\lambda(i,j)=1$, it implies that the j-th logic circuit pattern at the node "i" is selected. When the restriction condition formulae related to the delay time are represented with employment of this selective variable $\lambda(i,j)$, the following formulae are obtained. It should be noted that symbol "C(K)" is delay time restriction with respect to the path "k".

As to a certain path "k", the selective parameter $\lambda(i,j)$ which may satisfy the following formulae is obtained with respect to the node "i" contained in this path "k":

$$\Sigma_i \Sigma_j \lambda(i,j) \cdot d(i,j) \leq C(k) \quad (1)$$

$$\Sigma_j \lambda(i,j) = 1 \, \forall \, i \quad (2)$$

$$0 \leq \lambda(i,j) \leq 1 \quad (3)$$

, where symbol "d(i, j)" corresponds to the delay time of the j-th logic circuit pattern, and a value of this symbol "d(i,j)" may be calculated from the logic circuit pattern information table 180. If $\lambda(i,j)$ is regarded as a probability variable $\Sigma_j \lambda(i,j) \cdot d(i,j)$ contained in the above-described formula (1) may be conceived as an expected value for the delay time of the node "i". Although d(i,j) is handled as the logic stage number in the present embodiment, d(i,j) may be obtained by changing the weight per one stage, depending upon NOT, OR and AND contained in the logic circuit pattern. These restriction formulae with respect to "m" pieces of paths are formed.

As represented in the formula (3), the normal linear equation is obtained by setting $\lambda(i,j)$ to a continuous variable changing at [0, 1].

The objective function of the number of gates may be represented by employing $\lambda(i,j)$ as follows. A summation of a total number of gates is made with respect to all of the nodes "i".

$$G = \Sigma_i \Sigma_j \lambda(i,j) * g(i,j) \quad (4)$$

It should be noted that symbol "g(i,j)" corresponds to the number of gates contained in the j-th logic circuit pattern at the node "i", and a value thereof may be obtained from the logic circuit pattern information table. Assuming now that $\lambda(i,j)$ is regarded as a probability variable similar to the above-described formula (1), $\Sigma_j \lambda(i,j) g(i,j)$ contained in the equation (4) may be conceived as an expected value of the gate number at the node "i".

STEP 5: Obtaining a Solution by Utilizing the Simplex Method (740)

In the example shown in FIG. 3, the logic circuit pattern 1 shown in FIG. 5 is generated from the node 3. Also, both the logic circuit pattern 2 and logic circuit pattern 5 indicated in FIG. 5 are produced from the node 4, to which selective parameters $\lambda(4,1)$ and $\lambda(4,2)$ are allocated. To other nodes, each of the nodes is allocated as the selective parameter. That is to say, the selective parameter $\lambda(1,1)$ is allocated to the node 1, the selective parameter $\lambda(2,1)$ is allocated to the node 2, and the selective parameter $\lambda(5,1)$ is allocated to the node 5. With employment of these selective parameters and the values of the delay times stored in the logic circuit pattern information table, the restriction condition formulae based on the formulae (1) and (2) are formed. Thus, the formed condition formulae are shown in FIG. 10. FIG. 10a shows a list for the restriction condition formulae of the delay times, and FIG. 10b shows a list for the restriction condition formulae of the selective parameters.

Further, the objective function is given by the following equation:

$$G = 2\lambda(3,1) + 4\lambda(4,1) + 6\lambda(4,2) + \lambda(1,1) + 2\lambda(2,1) + 2\lambda(5,1)$$

Under the restriction condition formulae shown in FIG. 10, when the value of "$\lambda$" in which the above-described objective function is minimized is calculated, the selective parameters (4,1)=1 and (4,2)=0 are obtained.

There is a possibility that "$\lambda$" is generally not equal to an integer, but to a real number. When "$\lambda$" becomes a real number, the value of "$\lambda$" which is not equal to "0" or "1" is corrected to be 1 or 0 so as to again satisfy the restriction condition with respect to "$\lambda$" that is not equal to "0" or "1".

STEP 6: Determining Logic Circuit Patterns for Each of Nodes (750)

Based on the solution $\lambda(i,j)$ obtained by employing the simplex method, a selection is made of one optimized logic circuit pattern among a plurality of logic circuit patterns for every nodes. In the example shown in FIG. 3, the logic circuit pattern 2 shown in FIG. 5 for the node 4 is selected from the results of STEP 5.

In the case when the logic circuit is partially changed, for example, even when only the node 3 shown in FIG. 3 is changed, the optimization condition is varied, since other nodes appearing on the paths through which the node 3 passes, and also the node appearing at another path, e.g., the node 4 are connected via the node 2. As a result, even when the logic circuit is partially varied, it is necessary to employ the optimization method according to the present invention with respect to the overall logic circuit.

Figure 9:
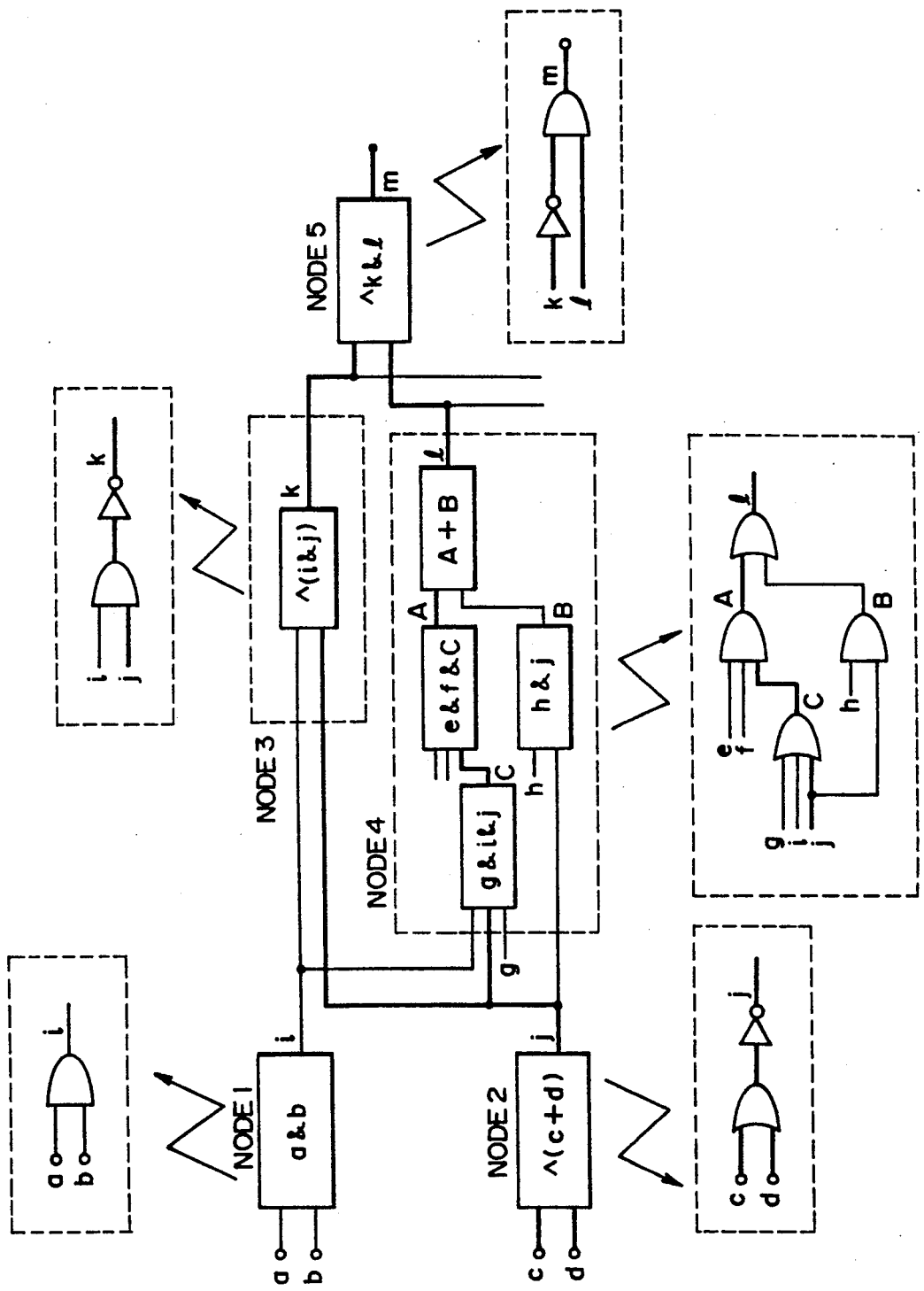
FIG. 9 pictorically represents a result of optimization process for the logic circuits shown in FIG. 2.

The results obtained by optimizing the logic circuits shown in FIG. 3 by way of the above-explained optimization method are shown in FIG. 9. Assuming now a three-input gate as a logic gate, the total number of gates employed in the logic circuit shown in FIG. 9 were reduced from 20 to 11, and the delay time thereof was shortened from 7 to 6, as compared with those of the logic circuit shown in FIG. 2.

Figure 11:
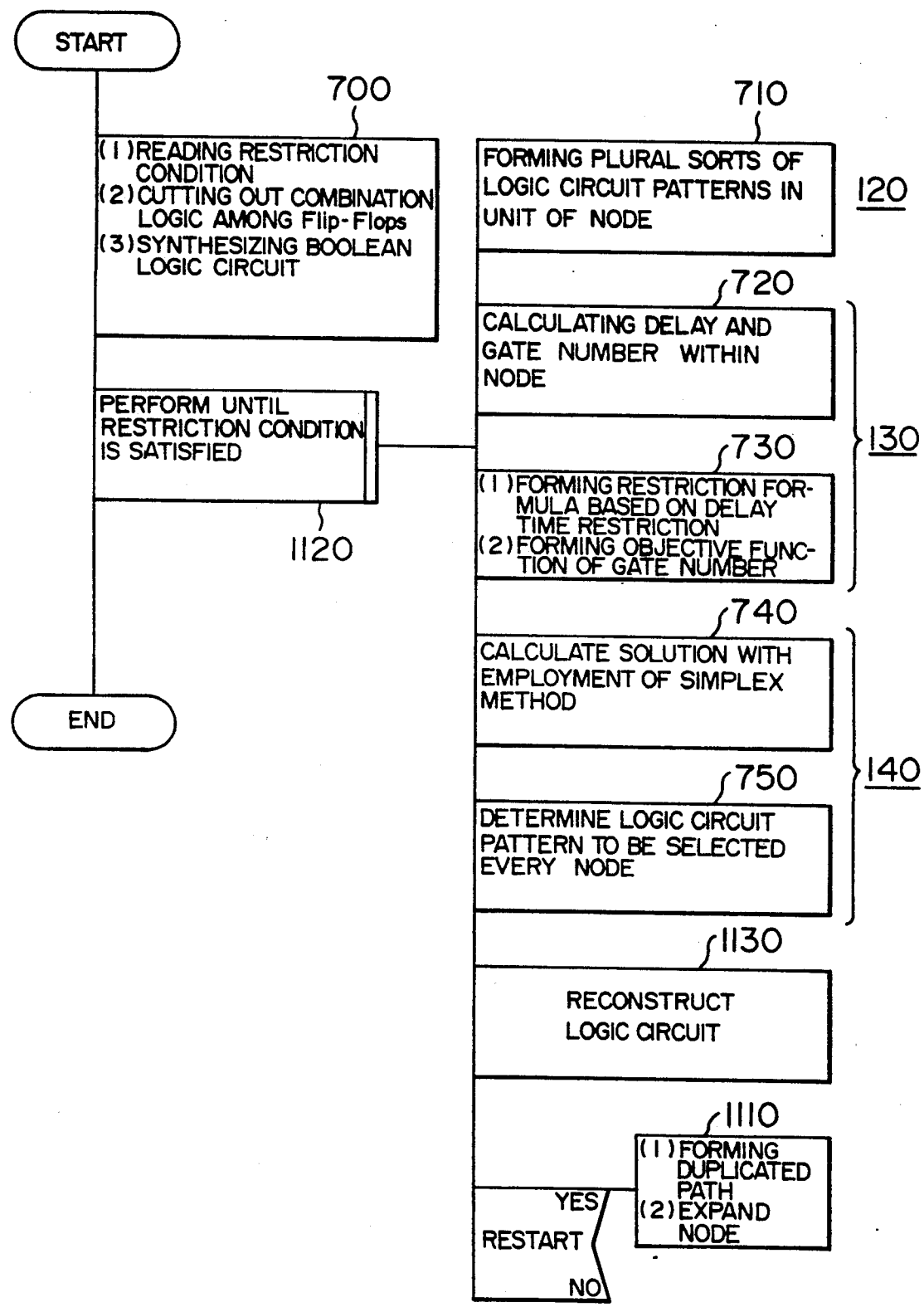
FIG. 11 represents an example of an improved processing sequence.

If the logic circuit satisfying the design restriction cannot be obtained in the process sequence shown in FIG. 8, this process sequence shown in FIG. 8 may be improved as represented in FIG. 11. When the Boolean network to be objected cannot satisfy the design restriction in the process sequence shown in FIG. 11, after the logic circuit has been reconstructed (process 1130) with employment of the already selected logic circuit pattern, a duplicated path is produced by partially duplicating the logic circuits contained in the respective nodes by the number of fan out, so that the scale of the logic circuit contained in the nodes is expanded by performing the node expansion 1110. As a result, since the selection range of the logic circuit pattern corresponding to the logic circuit contained in a single node is enlarged and the logic pattern to be produced are changed, there are great possibilities to obtain the solution for satisfying the design restriction.

As previously described, with respect to the overall logic circuit to be objected, both shortening the delay time and reducing the gate number are simultaneously performed, whereby the logic circuits having less redundancy and capable of satisfying the restriction may be achieved.

FIG. 20 is a schematic diagram for showing an arrangement of a program of the logic circuit pattern generating process 120. In the logic circuit pattern file 30, various table data have been stored which require to execute the logic circuit pattern generating process. In accordance with the method of the present invention, the logics which have been stored in the Boolean network register table 160 are read, both the factoring process 122 and the node dividing process 128 are performed every nodes corresponding to one Boolean expression, and thereafter the results are outputted into the logic pattern register table. The factoring process 122 is such a process that one Boolean is factorized so as to form the logic circuit pattern. In accordance with the factoring process 122, the inputted logic circuits are expanded into a logic circuit pattern management table 120 for managing some logic circuit patterns which have been converted into circuits functionally equal thereto; a cube register table 125 indicative of a corresponding relationship between each multiply item contained in the respective logic circuit patterns and the signals used therein; and, a logic information table 126 describing an input/output relationship with the functions of the respective items for constructing the respective logic circuit patterns, and then the results obtained by the factorization are newly stored in the logic information table 126. When the factorization is carried out, no restriction on the number of inputs of AND nodes and OR nodes is taken into account. The facterized results are transported via the logic information table 126 to the node dividing process 128. In the node dividing process 128, according to the restriction on the number of inputs for the nodes, the node division is executed, while considering the signal delay.

Figure 12:
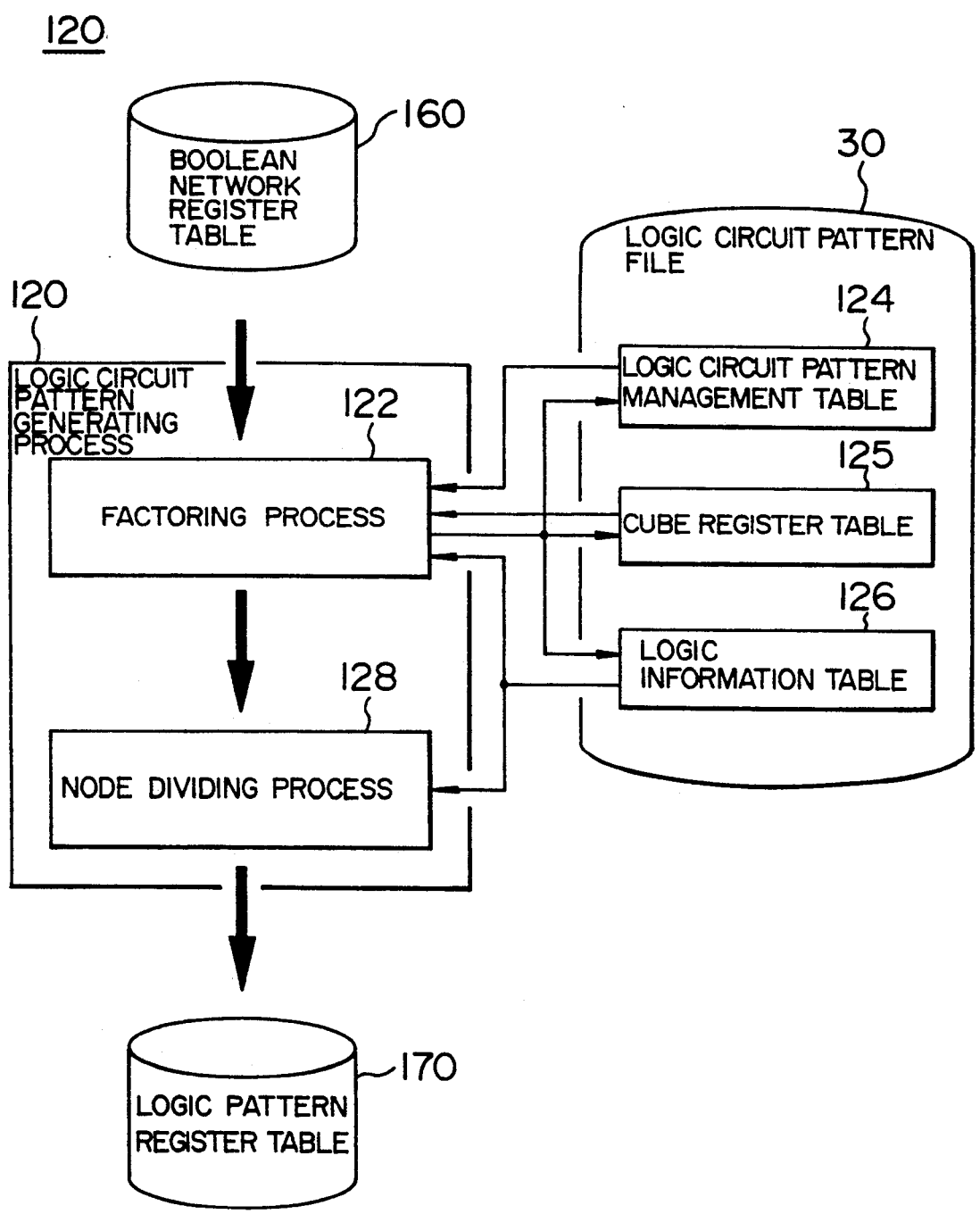
FIG. 12 is a diagram for showing a program arrangement of a logic circuit pattern generating process 120.

FIG. 13 represents schematic diagrams in which delay times are different from each other by the sequence of the factorization effected in the factoring process 122 shown in FIG. 12.

Figure 13A:
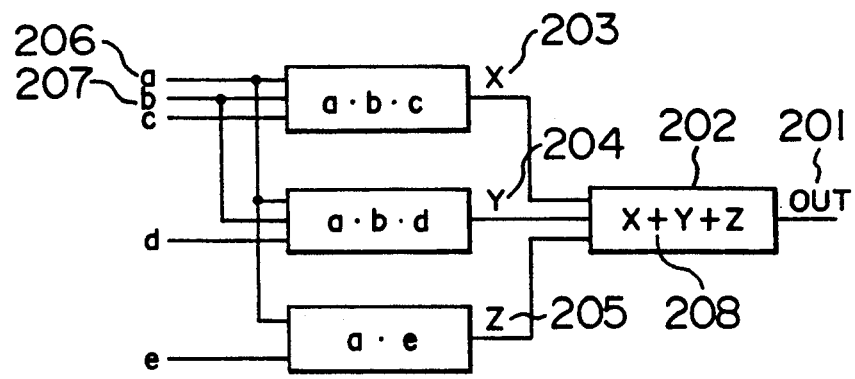
FIGS. 13A–13C are diagrams for showing an improvement in a delay time of a signal by a factoring.
Figure 13B:
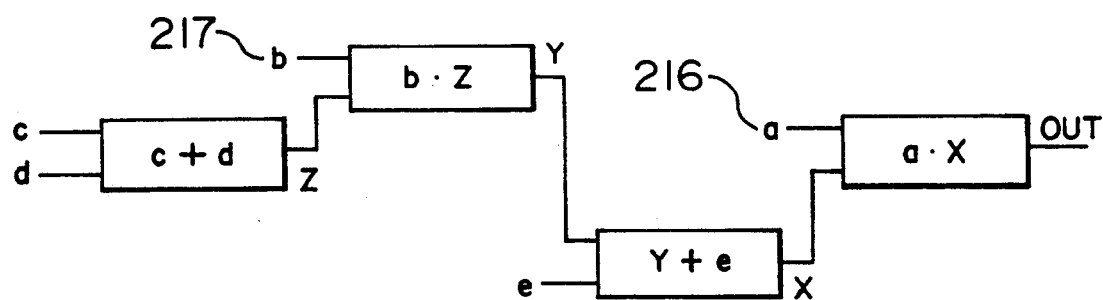
Figure 13C:
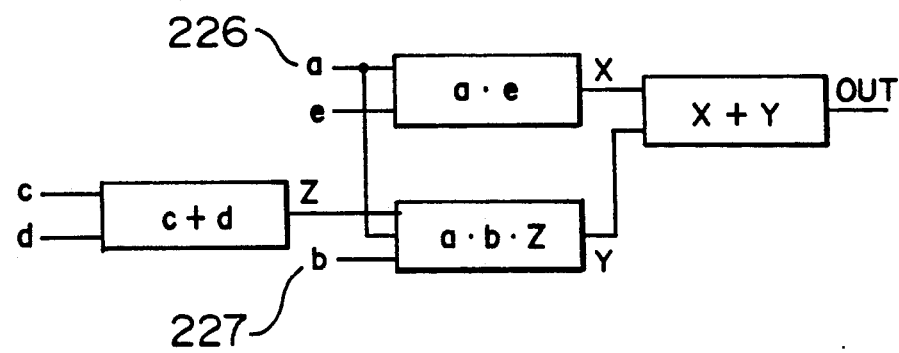

When a multiply/summation type Boolean expression "a.b.c+a.b.d+a.e" is expressed by a logic circuit diagram, it becomes FIG. 13a. In FIG. 13, signals X203, Y204 and Z205 are inputted into a node 202, and a signal OUT 201 is newly arranged by a Boolean expression 208 to be outputted. When it is factorized by a "signal a", it becomes FIG. 13b. As a result, since the signal a 206 approaches the output terminal, similar to the signal a 216 shown in FIG. 13b, the delay time is shortened. If the sequence of factorization by the signals is changed, nodes where the respective signals are arranged are different from each other, and also the delay times are changed. FIG. 13b represents such a case where the factorization is carried out by "a" and subsequently by "b", whereas FIG. 13c represents such a case where the factorization is performed by "b" and subsequently by "a". The signals a216 and b217 shown in FIG. 13b, and also the signals a226 and b227 shown in FIG. 13c are different from the respective output terminals as to the distances and also the delay times. As previously described, the logic circuits whose functions are equal to each other and delay times are different from each other by changing the factoring sequence for the signals can be obtained.

Figure 14A:
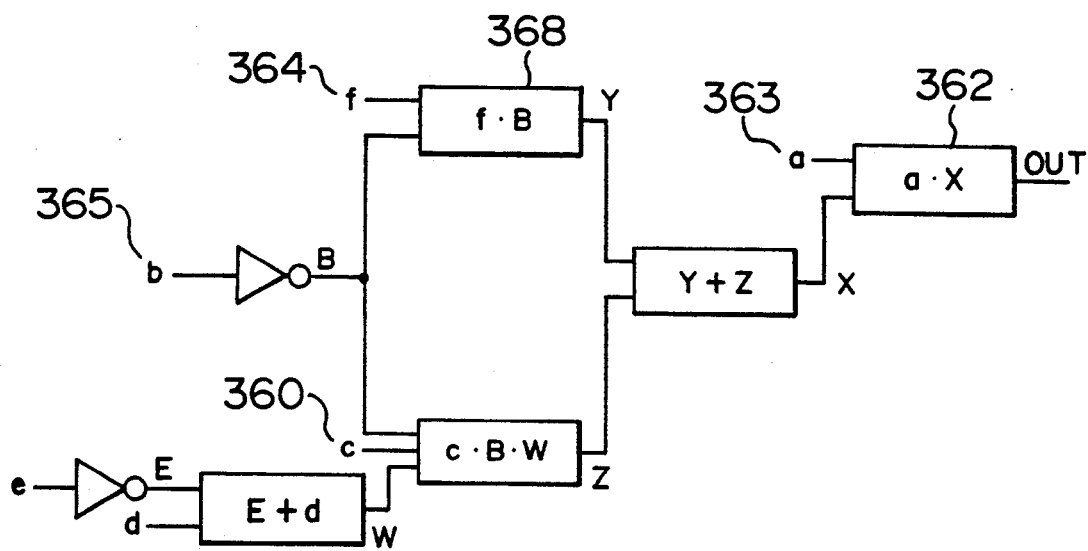
FIGS. 14A and 14B are illustrations for explaining a single handling operation for a plurality of signals.
Figure 14B:
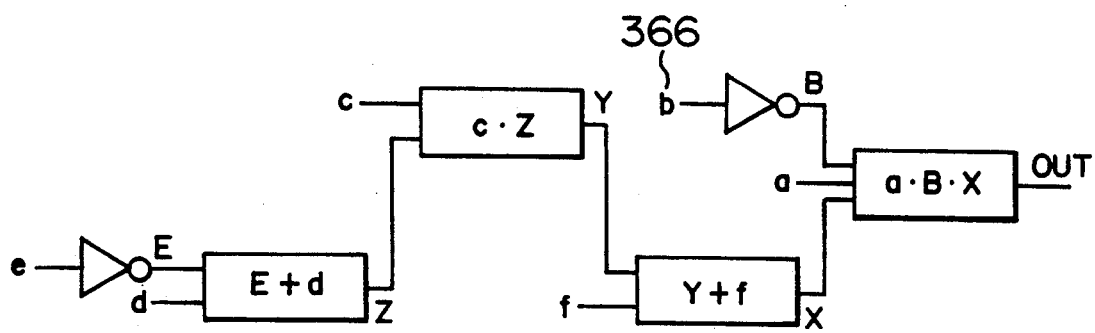

FIG. 14 represents an example in which a plurality of signals may be handled in the factoring process 122 shown in FIG. 12, according to the conventional method, when the logic circuit pattern is formed by way of the above-explained factorization, in case that "n" pieces of input signals are present, a sequence for "n" pieces of signals is formed and then the factorization is performed in accordance with the respective sequences. However, when the number of signals is equal to "n", n! types of calculations must be carried out so as to form the logic circuit patterns, which requires very long processing time. According to the present invention, the delay time may be shortened by reducing the number of signals "n". As this means, the signals are grouped in order to handle a plurality of signals. FIG. 14 represents factorized results of a sum of product form Boolean expression "a.^b.c.d+a.^b.-c.^e+a.^b.f" in a different method. In FIG. 14a, the factorization is performed by a signal a 363. Subsequently, the factorization is performed by a signal c360. Finally, the factorization is carried out by a signal b365. However, since there is no limitation in the number of inputs for the respective nodes in the example shown in FIG. 14, even when both a signal "a" and a signal "b" are arranged to a node 362 connected to the output terminal, there is no increase in the delay times of the signals f364 and c360 arranged at the node 368 positioned closer the output terminal than the signal "b". The results obtained by the above-described factorization are shown in FIG. 14b. This result corresponds to such a result obtained after being factorized by a.^b and then factorized by "c". In other words, the resultant logic circuit patterns are identical to each other even when the signals "a" and "b" are separately handled so as to be factorized, and also even if the signal "a.^b" is handled as a single signal. As previously described, when the multiply items of plural signals are handled as a single signal, the number of signals may be reduced.

Figure 15:
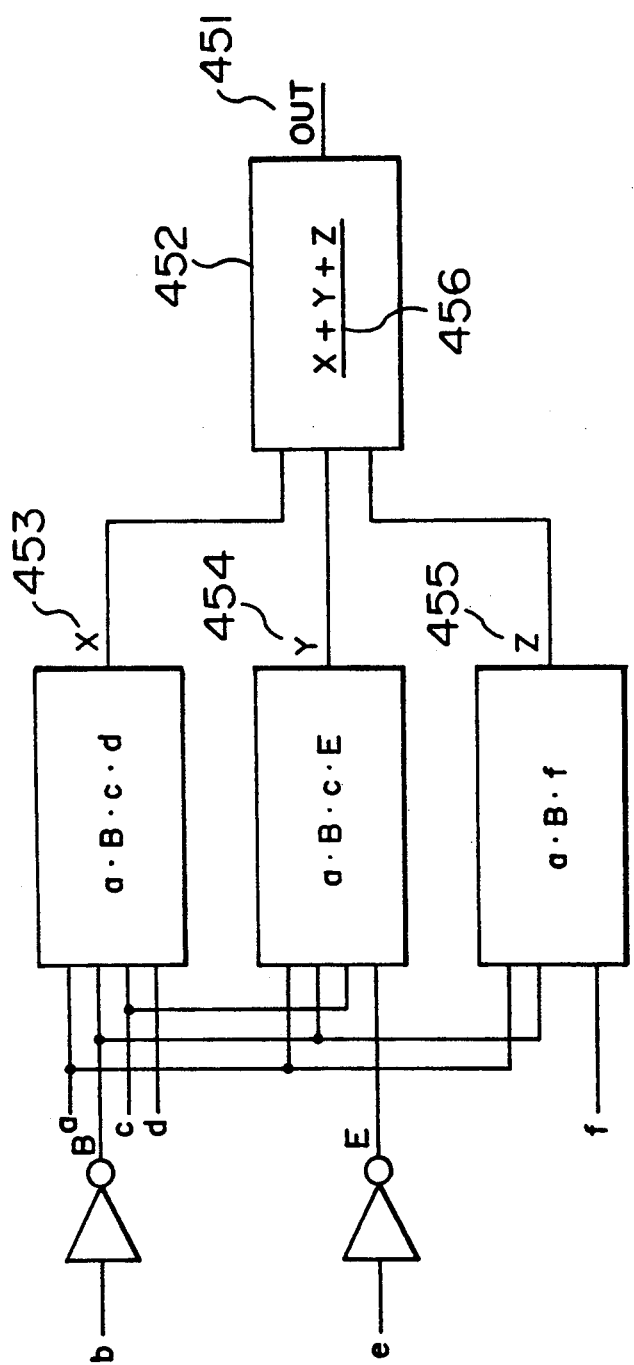
FIG. 15 is a diagram for indicating an objective logic circuit employed in an embodiment.

FIG. 15 represents a logic circuit which will be employed in the following explanation. The logic circuit shown in FIG. 15 is expressed by the sum of product form Boolean expression:

a.^b.c.d+a.^b.c.e+a.^b.f.

This logic circuit is similar to that shown in FIG. 14. The node 452 receives signals X453, Y454 and Z455 as inputs, an output signal OUT 451 is constructed by a Boolean expression 456 and is outputted. Further, a logic circuit diagram of FIG. 20 is similar to that of FIG. 15.

FIG. 16 is an example of a structure of a logic circuit pattern management table 124. The management table 124 is constructed of an item number 530, a logic circuit pattern name storage region 540 for storing therein names of logic circuits, and a logic information table pointer storage region 550 for designating entires of the logic information table 126. The logic information table pointer storage region 550 is constructed of a head item number storage region 551 for showing a head of entry of each logic circuit pattern which has been stored in the logic information table 126, and an element number storage region 552 for representing element numbers.

FIG. 17 represents an example of an arrangement of the logic information table 126. The respective logic circuit patterns are stored as 1 entry for each of the sum of product form Boolean expression. This information table 126 is arranged by an item number 630, a region 640 for storing Boolean expressions indicative of functions thereof; a region 650 for storing connection information, and also a region 660 for storing pointers for the cube register table. The connection information storage region 650 is arranged by a region 651 for storing therein the input signals and a region 652 for storing therein the output signals. When identification is carried out between the input signal and output signal, the connecting relationship of the logic circuit patterns may be obtained. Then, the cube register table pointer storage region 660 is arranged by a head item number storage region 661 for representing entries on the cube register table for heads of the multiply items ever Boolean expressions, and also an element number storage region 662 indicative of the number of elements.

Figures 18A, 18B:
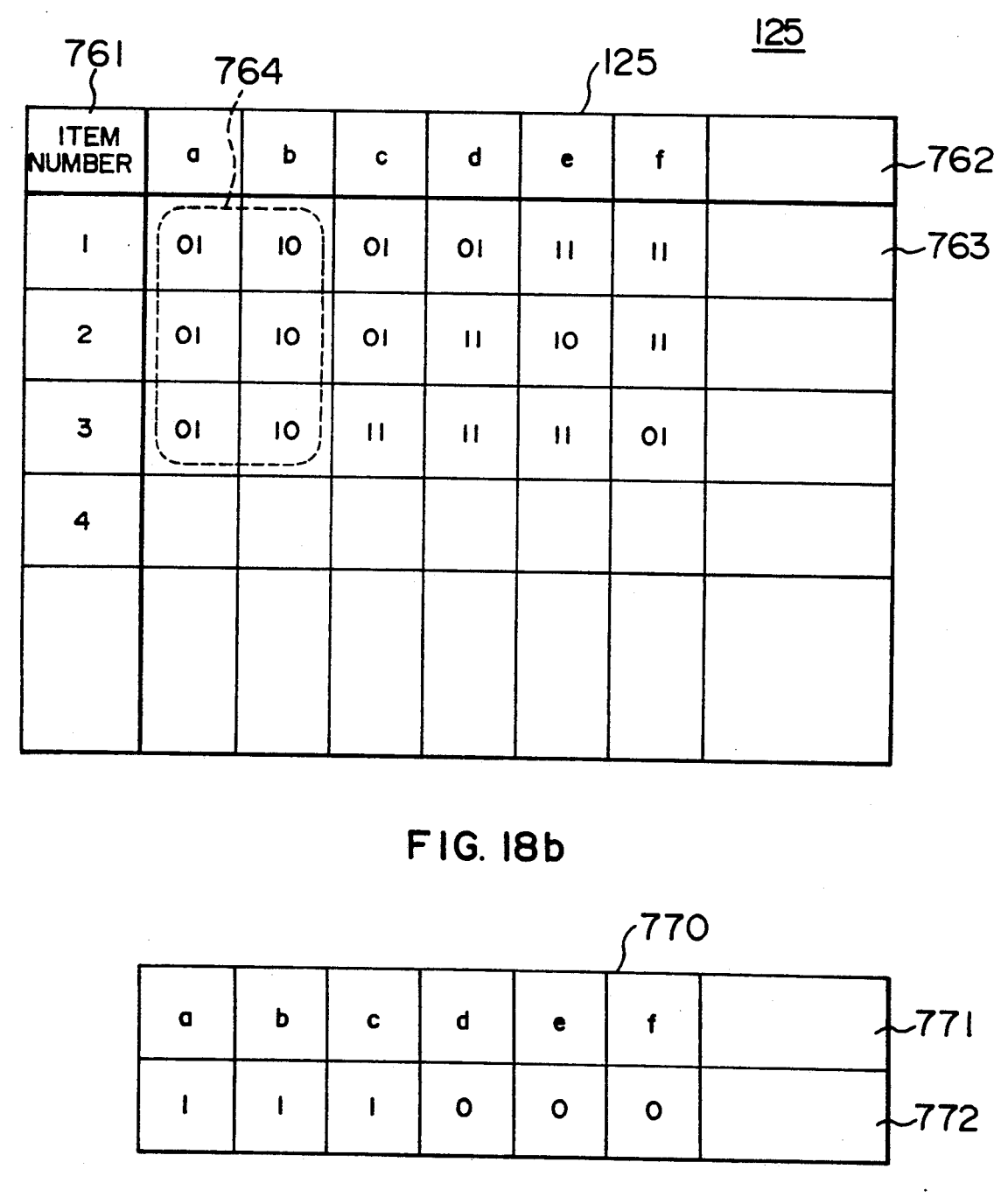

FIG. 18 represents an example of structures of the cube register table 125 and a literal vector 770. The cube register table 125 is constructed of an item number 761, a signal storage region 762, and a region 763 to store therein logic values of the respective multiply terms 1 entry corresponds to 1 multiply term. In case of a true literal (for instance, 'a' for 'a.^b.c' 0, 01 corresponding to the respective signals is stored in this storage region. In case of a false literal (for instance, '^b' for 'a.^b.c'), 10 is stored in the region. When no value appears in the multiply item, 11 is stored in the region. To the contrary, the literal vector 770 is arranged by a signal storage region 771 and an appearing degree storage region 772. In this storage region 772, when any one of the true literal arid false literal appears more than two times every signal, "1" is stored, and "0" is stored at any appearances other than the above case.

Figure 19:
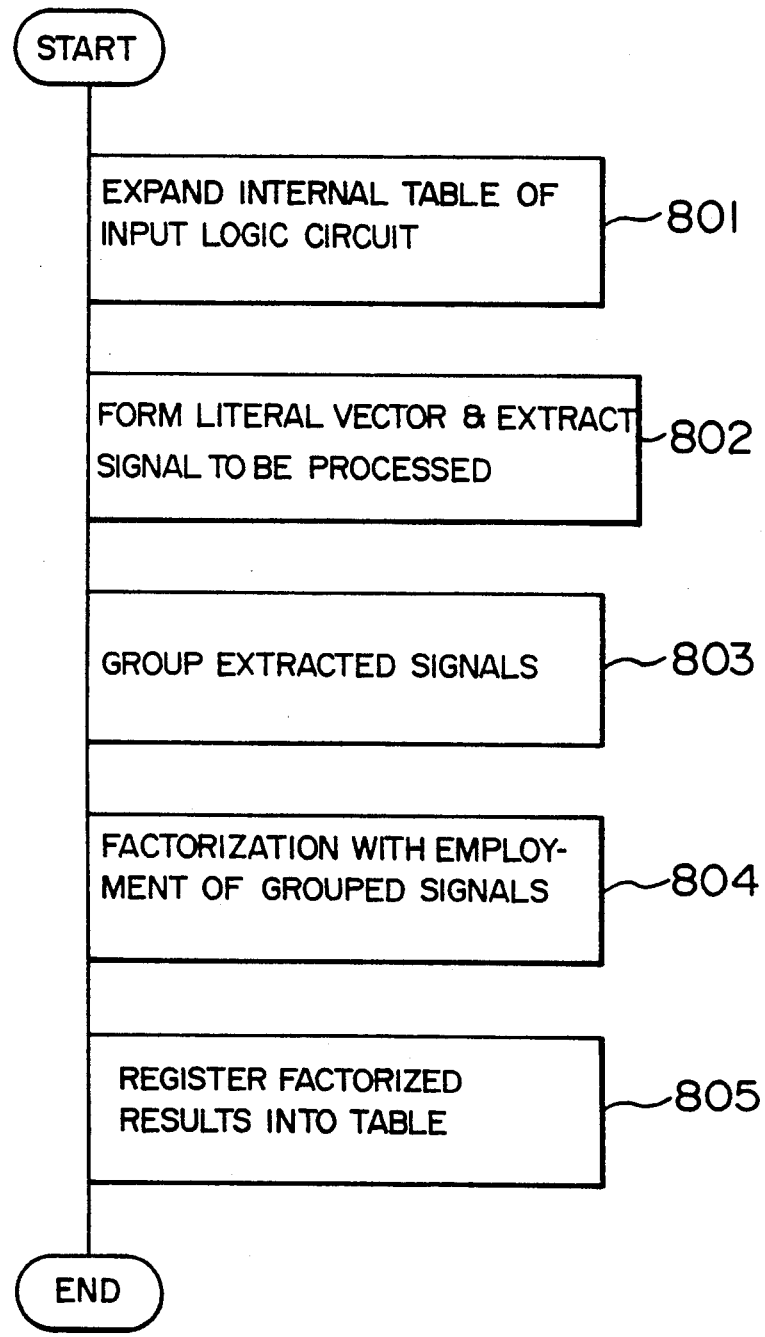
FIG. 19 is a PAD diagram for representing a sequence of a factoring process; and, FIGS. 20A and 20B represent a result for producing a logic circuit pattern by a different factoring process from the logic circuit shown in FIG. 15.

FIG. 19 is a PAD diagram for representing a process sequence of the factoring process 122. This PAD diagram is constructed of an internal table expanding process 801 for an input logic circuit; a process 802 for extracting a signal to be processed and for forming a literal vector; a process 803 for grouping the extracted signal; a factoring process 804 with employment of the group signal; and also a process 805 for registering a result of the factoring process into a table.

In the process 801 for expanding the internal table of the input logic circuit, the logic circuit which has been expressed by a summation of the multiply term and corresponds to the Boolean expression not yet factorized, is expanded into a logic circuit pattern management table 124, a logic information table 126 and a cube register table 125. An example where the logic circuit shown in FIG. 15 has been expanded, is represented at the item number of 1 in the logic circuit pattern management table 124 shown in FIG. 16, the item number of "1" in the logic information table 126, and the cube register table 125 shown in FIG. 18.

Under the forming process of the literal vector 770 and the extracting process of the signal to be processed, the cube table 125 is retrieved in the vertical direction, if either 01 or 10 is present more than two pieces, then "1" is stored in the literal vector 770 and "0" is stored therein in any cases other than the above case. In the region 772 of FIG. 18b, there is shown an example in which a literal vector has been formed with respect to the example of FIG. 15. A selection is made of such a signal that "1" has been stored into the literal vector, for the factorization purpose.

In the process 803 for grouping the extracted signal, a detection is made of such a signal that among the signals in which the values of the lateral vectors have been 1, these signals may be handled as a single signal by combining common items. A row direction of this table indicates a multiplication of signals, whereas a column direction thereof represents a summation thereof. After either row or column has been substituted on the cube table, signals are grouped in such a manner that among the data series along the column direction in which the value becomes 01 or 10 other than 11 appearing in the column direction, these grouped signals correspond to the data series whose lengths are identical to each other and are the longest. In the example shown in FIG. 18, it corresponds to a region 764 surrounded by a dot line. That is to say, a.^b are combined with each other and are factorized as a single signal.

In the process 804 with the factoring operation with employment of the grouped signal, a single signal is to be factorized among the grouped signals and literal vectors other than these grouped signals. That is, a quotient is obtained for the Boolean expression under such a condition that the above-described signal is a factor. If the conventional method is applied to the example shown in FIG. 18, since 6 signals are present, 6!=720 different ways of the factoring operation must be carried out.

To the contrary, according to the present invention, the signal to be processed with employment of the literal vector 770 is restricted, and then the signals to be processed by way of the grouping process are selected to be 2 sorts, whereby only 2!=2 different ways of the factoring operation are merely performed.

Figure 20A:
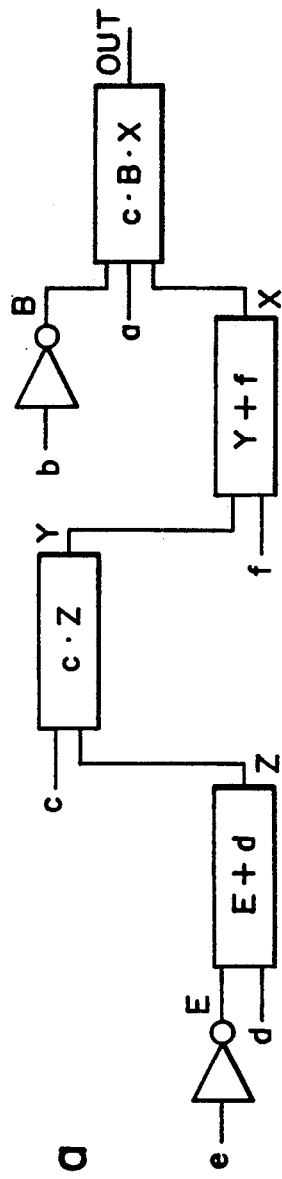
Figure 20B:
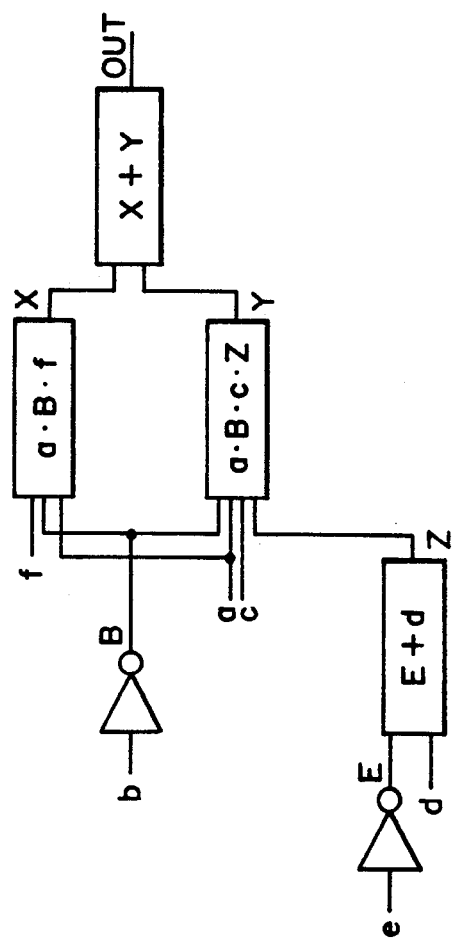

In FIG. 20, there is shown a result of factoring operation performed in accordance with the above-described sequence. FIG. 20a represents a logic circuit when a signal "c" is factorized as a factor. FIG. 20b indicates a logic circuit when a grouped signal "a.^b" is factorized as a factor.

Subsequently, in accordance with the table register process 550, the factorized results are stored into the item numbers 2 and 3 of the logic circuit pattern management table 124, and the item numbers 2 to 4 and the item numbers 5 and 6 of the logic information table 126. The stored results are indicated by the item numbers 2 to 3 of FIG. 16 and by the item number 2 of FIG. 17.

In case that a factorization is similarly performed with respect to the remaining quotient after the factorization, similar values are set into the pointer 660 at the item numbers after 2 of FIG. 17.

Finally, the node dividing process 128 is performed with the logic information table 126 as an input. In this node dividing process 128, assuming now that a maximum value is selected to be the number of fan in with respect to one gate, the Boolean expression corresponding to the logic gate circuits is divided. As a result of this process 125, the connecting relationship among the nodes corresponding to a single Boolean expression may be obtained. Furthermore, a single Boolean expression may be subdivided into various sorts of circuits by adding limitations to the delay time.

As previously stated, the signals whose delay times should be improved are selected to be grouped, so that a total number of signals to be processed may be reduced and thereby the delay time required for the factorization may be shortened.

What is claimed is:

1. A method, executed by a computer, of modifying a digital logic circuit represented by a Boolean expression comprised of a plurality of portions each of which is represented by a Boolean expression, said method comprising the steps of:

forming a plurality of groups of logic circuits each represented by a Boolean expression, where each group corresponds to one of said plurality of portions, wherein Boolean expressions which represent logic circuits of each group are equivalent in function to a Boolean expression which represents one of said corresponding portions and are formed by modifying said Boolean expression which represents the corresponding portion, so that one of the logic circuits of each group will have a delay time and a gate number which is different from others of said logic circuits of said each group, in a case where the logic circuits of each group are realized by logic gates of predetermined kinds;

forming, as candidates for a digital logic circuit after modification, plural combinations each comprised of a plurality of logic circuits each represented by a Boolean expression, each logic circuit representing a Boolean expression corresponding to one of said portions and being selected from a group of logic circuits formed for said corresponding portion by said forming a plurality of groups step;

evaluating a delay time and a total number of logic gates of each combination, in a case where the logic circuits represented by Boolean expressions which constitute said each combination are realized by logic gates of said predetermined kinds; and selecting one of the combinations which will have a delay time which is less than or equal to a predetermined delay time and a total number of logic gates which is minimized among said combinations, as a new digital logic circuit after modification of said digital logic circuit.

2. The method according to claim 1 wherein,
a Boolean expression representing each of said plurality of portions comprises a sum of Boolean products; and,
the forming step of said groups includes a step of modifying said Boolean expression representing each portion by factorizing said Boolean expression with respect to different ones of plural signals which appear in said Boolean expression.

3. The method according to claim 2 wherein,
the forming step of said groups further includes a step of detecting whether plural ones of plural signals which appear in said Boolean expression representing said corresponding portion appear together in plural ones of product terms within said Boolean expression; and,
said factorizing is executed with respect to a product of plural signals which have been detected as ones which appear together in plural products terms within said Boolean expression.

4. The method according to claim 2 wherein,
the forming step of said groups further includes a step of detecting whether plural signals which appear in said Boolean expression representing said corresponding portion appear in plural ones of product terms within said Boolean expression; and,
wherein said factorizing is omitted with respect to a signal which has been detected as one which appears only in one of the plural product terms within said Boolean expression.

5. The method according to claim 1 wherein,
the predetermined delay time is expressed in terms of a total number of logic gate stages;
the delay time of each logic circuit expressed by a Boolean expression is measured in terms of a total number of logic gate stages along which a signal passes from an input to an output within a logic circuit which will be obtained in each logic circuit is realized by the logic gates of said predetermined kinds; and
the delay time of each combination is measured as a sum of logic gate stages measured for logic circuits which belongs to each combination.

6. The method according to claim 1, further including the steps of:
copying, in a situation where a delay time of any of the combinations is larger than the predetermined delay time, at least one Boolean expression representing one of said plurality of said portions into another Boolean expression representing another of said portions, so as to form a new Boolean expression comprised of a combination of said copied Boolean expression and said another Boolean expression, as a new Boolean expression representing a new enlarged portion to be used instead of said another portion; and
executing the forming step of said groups to the selecting step of a new digital logic circuit which includes the new portion represented by said new Boolean expression, instead of said another portion.

7. The method according to claim 1, wherein one of the selected combinations has a delay time which is greater than a delay time of the digital logic circuit.

* * * * *